(12) United States Patent
Johnson

(10) Patent No.: US 6,489,984 B1
(45) Date of Patent: Dec. 3, 2002

(54) PIXEL CROSS TALK SUPPRESSION IN DIGITAL MICROPRINTERS

(76) Inventor: Kenneth C. Johnson, 2502 Robertson Rd., Santa Clara, CA (US) 95051

(*) Notice: Subject to any disclaimer, the term of this patent is extended or adjusted under 35 U.S.C. 154(b) by 0 days.

(21) Appl. No.: 09/670,507

(22) Filed: Sep. 26, 2000

Related U.S. Application Data (63) Continuation-in-part of application No. 09/473,081, filed on Dec. 28, 1999, now abandoned.
(60) Provisional application No. 60/114,014, filed on Dec. 29, 1998.

(51) Int. Cl.[7] .................................................. B41J 2/47
(52) U.S. Cl. .................................... 347/239; 347/255
(58) Field of Search ................................. 347/239, 241, 347/244, 255, 256, 258; 349/41, 74, 95; 359/289, 279, 285, 323; 385/116

(56) References Cited

U.S. PATENT DOCUMENTS

| | | | |
|---|---|---|---|
| 4,848,879 A | * | 7/1989 | Nishimura et al. ......... 359/289 |
| 4,954,789 A | | 9/1990 | Sampsell, Jeffrey B. .... 359/318 |
| 5,221,989 A | * | 6/1993 | Stappaerts et al. .......... 359/323 |
| 5,225,920 A | | 7/1993 | Kasazumi et al. ............. 349/1 |
| 5,539,568 A | | 7/1996 | Lin et al. ..................... 359/285 |
| 5,691,541 A | | 11/1997 | Ceglio et al. ............ 250/492.1 |
| 5,870,176 A | | 2/1999 | Sweatt et al. .................. 355/53 |
| 5,914,802 A | | 6/1999 | Stappaerts et al. .......... 359/279 |
| 5,930,433 A | * | 7/1999 | Williamson et al. ........ 385/116 |
| 5,949,503 A | * | 9/1999 | Koyama et al. ............... 349/41 |
| 6,031,643 A | | 2/2000 | Burr ............................ 359/28 |

FOREIGN PATENT DOCUMENTS

| | | | |
|---|---|---|---|
| WO | WO 97/05526 | 2/1997 | ........... G03F/1/100 |
| WO | WO 97/34171 | 9/1997 | ........... G02B/21/06 |
| WO | WO 98/04950 | 2/1998 | ........... G02B/26/00 |
| WO | WO 99/00706 | 1/1999 | ............. G03F/7/20 |

OTHER PUBLICATIONS

Choksi et al., "Maskless extreme ultraviolet lithography," *J. Vac. Sci. Technol.* B 17(6), Nov./Dec. 1999, pp. 3047–3051.
Folta, J.A. et al., "High density arrays of micromirrors," Feb. 1999, pp. 1–9 (UCRL–ID–133164/ *National Technical Information Service*, US Dept. of Commerce, Springfield, VA 22161).

\* cited by examiner

*Primary Examiner*—Hai Pham
(74) *Attorney, Agent, or Firm*—Townsend and Townsend and Crew LLP (57) ABSTRACT

Digital microprinters such as maskless projection lithography systems can be adversely affected by pixel cross talk resulting from coherent interactions between adjacent pixels. Such effects are significantly mitigated by inducing a $\pi/2$ optical phase shift between adjacent pixels. In one implementation, the printing surface is exposed twice, with the phase shift sign-inverted between exposures so that coherent interaction effects cancel out between the two exposures.

27 Claims, 7 Drawing Sheets

PIXEL CROSS TALK SUPPRESSION IN DIGITAL MICROPRINTERS

CROSS-REFERENCE TO RELATED APPLICATIONS

This application is a continuation-in-part of U.S. patent application Ser. No. 09/473,081, filed Dec. 28, 1999, now abandoned, for "Pixel Cross Talk Suppression in Digital Microprinters," which claims priority from provisional application No. 60/114,014, filed Dec. 29, 1998, for "Pixel Cross Talk Suppression in Digital Microprinters," the disclosures of both being incorporated by reference.

BACKGROUND OF THE INVENTION

The invention relates generally to digital microprinters and more specifically to digital microprinters such as maskless projection lithography systems that use spatial light modulators (SLMs) for optical pattern generation (Refs. 1–6).

Such microprinters can be adversely affected by pixel cross talk resulting from coherent interactions between adjacent pixels. Such interactions could be mitigated by spacing the SLM pixels sufficiently far apart that there is no significant overlap between adjacent pixels' point spread functions at the image plane. Or alternatively, pixel exposures could be sequenced so that adjacent pixels are never on at the same time. However, these approaches can result in very low optical efficiency because illumination energy that intercepts the SLM between pixels, or on pixels that are in their off state, is wasted. Printing speed is limited by optical efficiency, so it would be desirable to use closely spaced pixels and to allow adjacent pixels to be simultaneously on in order to optimize efficiency.

SUMMARY OF THE INVENTION

This invention provides an optical technique for mitigating pixel cross talk resulting from coherent interactions between adjacent pixels in a digital microprinter. No loss in optical efficiency or printing speed is incurred.

The invention is applicable to a printer system that uses a spatial light modulator (SLM) for image generation. The SLM comprises an array of source pixel elements, each of which is digitally controlled to modulate illuminating radiation intercepting the pixel. Either a transmission-type or reflection-type of SLM can be used. A projection system conveys the modulated radiation to a printing surface wherein each source pixel generates a corresponding modulated exposure field that exposes the surface. (In some embodiments the SLM may be imaged directly onto the printing surface. Alternatively, the SLM may be imaged onto an intermediate image plane proximate to a microlens array, wherein each microlens condenses the illumination from a corresponding source pixel onto a focal point on the printing surface.) Due to the projection system's limited optical resolution, adjacent pixels' exposure fields may overlap, resulting in pixel cross talk effects due to coherent interaction between the overlapping fields.

The coherent effects are significantly mitigated by configuring the SLM to induce an optical phase shift on alternate pixels, wherein the phase shift induces a phase offset of approximately $\pi/2$ between adjacent pixels' exposure fields. (Typically, the phase shift would be exactly $\pi/2$ at a specific wavelength within the illumination's spectral band.) If the exposure fields (without the phase shift) have a uniform phase distribution across the printing surface, this technique can substantially eliminate the coherent interaction between adjacent pixels. If the phase distribution is not uniform, an alternative technique can be employed in which two exposures are made, with the positional relationship between the SLM and printing surface altered between exposures so that the induced phase offset is sign-inverted.

A further understanding of the nature and advantages of the present invention may be realized by reference to the remaining portions of the specification and the drawings.

DESCRIPTION OF THE SPECIFIC EMBODIMENTS

Figure 1:
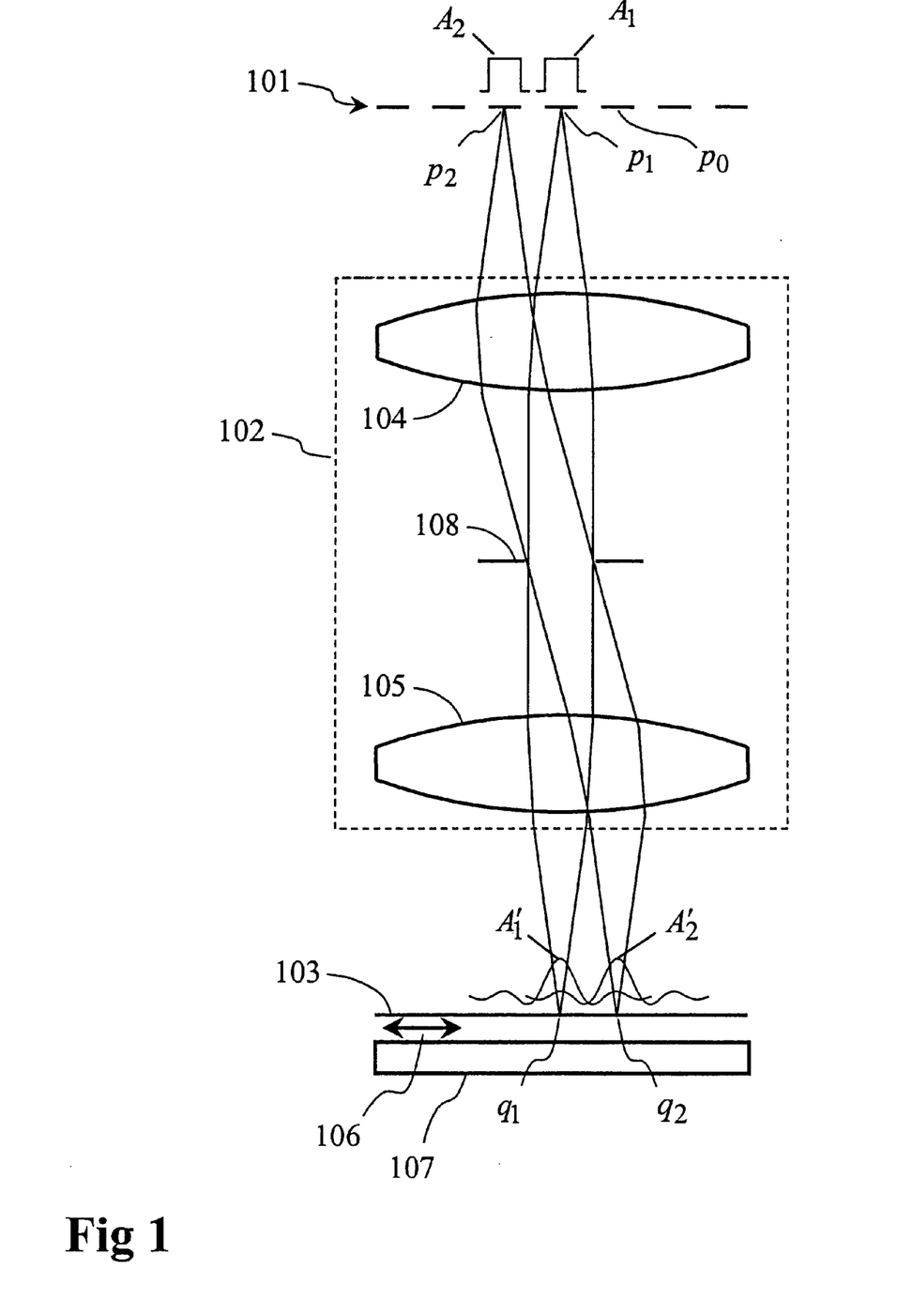
FIG. 1 schematically illustrates a printer system comprising an SLM, projection optics, and printing surface.

FIG. 1 schematically illustrates a printer system in which the invention could be used. An SLM 101 comprising an array of source pixel elements (e.g., pixels $p_0$, $p_1$ and $p_2$) is illuminated by a beam of optical radiation. Depending on the type of SLM employed, it can be illuminated either in transmission or reflection mode. (An example of the former would be a liquid crystal light valve. Two examples of the latter would be a Digital Micromirror Device, manufactured by Texas Instruments, or a Grating Light Valve, manufactured by Silicon Light Machines in Sunnyvale, Calif.)

Each pixel modulates a portion of the beam that intercepts it. The modulated portion is characterized by its complex electric field amplitude across the SLM aperture plane. For example, source pixels $p_1$ and $p_2$ generate respective modulated source field distributions $A_1$ and $A_2$ in FIG. 1. Each pixel-modulated source field is the source for a corresponding exposure field that exposes a printing surface. An optical projection system 102 conveys each source field to the printing surface 103. (The projection optics are illustrated schematically as a pair of lenses 104 and 105 and projection aperture 108 in FIG. 1, but alternative projection optics such as catadioptric systems may be employed.) The printed image may be generated as a multiple exposure of juxtaposed or overlapping pixellated images, with the printing surface scanned or stepped between successive exposures; or the surface may be scanned continuously as the SLM is modulated. (The scan motion is indicated as 106 in FIG. 1, and the scanning mechanism is indicated as 107.) During each exposure, the projection system focuses the source field $A_1$ from source pixel $p_1$ to a corresponding exposure field $A'_1$ centered at point $q_1$ on the printing surface; and source field $A_2$ from source pixel $p_2$ is similarly focused to corresponding exposure field $A'_2$ centered at point $q_2$. (The source and exposure fields are represented by their amplitude cross-sections in FIG. 1.) Although the source fields $A_1$ and $A_2$ are generally non-overlapping, there may be some overlap between the exposure fields $A'_1$ and $A'_2$ due to the system's limited imaging resolution.

The exposure irradiance E at any particular point on the printing surface is proportional to the magnitude-squared of the total field amplitude at that point. For example, if pixel $p_1$ is the only source pixel that is turned on the exposure distribution across the printing surface would be $$E = \eta |A'_1|^2 \text{ (pixel } p_1 \text{ on)} \quad \text{Eq. 1}$$

wherein $\eta$ is an efficiency factor that is related to the exposure duration and sensitivity. If pixels $p_1$ and $p_2$ are turned on sequentially for the same duration, the total exposure level would simply be the sum of two such distributions, $$E = \eta(|A'_1|^2 + |A'_2|^2) \text{ (sequential exposures)} \quad \text{Eq. 2}$$

However, if both pixels are turned on simultaneously, the exposure would be $$E = \eta |A'_1 + A'_2|^2 \text{ (simultaneous exposures)} \quad \text{Eq. 3}$$

(This assumes perfect coherence between the two fields.) The squared expression in Eq. 3 can be expanded to obtain $$E = \eta(|A'_1|^2 + |A'_2|^2 + 2Re[A'_1 A'_2{}^*]) \text{ (simultaneous exposures)} \quad \text{Eq. 4}$$

(wherein "Re" denotes the real part of a complex-valued quantity). Comparing Eqs. 4 and 2, it is evident that the simultaneous exposure distribution includes an extra coherent interaction term, denoted $\delta E$, which is not present in the sequential exposure distribution, $$\delta E = 2\eta Re[A'_1 A'_2{}^*] \quad \text{Eq. 5}$$

(If the assumption of perfect coherence does not hold, a partial coherence analysis yields a similar result, the only difference being that the amplitude of the coherent interaction term is reduced.) When more than two pixels are turned on there will be a number of such interaction terms present, one for each pair of "on" pixels. Generally, the only interaction terms that are significant are those corresponding to adjacent pairs of pixels (e.g., pixels $p_1$ and $p_2$ in FIG. 1), and the present invention operates to eliminate or mitigate such terms.

The principle of cross talk suppression can be illustrated by first considering the case wherein each exposure field (e.g., $A'_1$, $A'_2$, etc.) has substantially constant phase over the area where its magnitude is significant, and where any two adjacent such fields have substantially the same phase. (For example, this would be the case if the SLM is imaged onto the printing surface by means of a double-telecentric projection system.) Under these conditions the $A'_1 A'_2{}^*$ term in Eq. 5 is substantially real-valued, and $\delta E$ can be large in magnitude.

However, in accordance with embodiments of the invention, the coherent interaction term can be eliminated by modifying the SLM design to introduce a $\pi/2$ phase difference between adjacent pixels. This can be achieved by applying a $\pi/2$ phase shift to alternate pixels. (Specific methods for accomplishing this will be described below.) For example, suppose that in the modified design pixel $p_2$ is unchanged but pixel $p_1$ applies an extra phase shift of $\pi/2$ to the field. Again using the notation $A'_1$ and $A'_2$ to denote the exposure field amplitudes in the unmodified design (i.e., without the $\pi/2$ phase shift), the corresponding fields with the modification will be $iA'_1$ and $A'_2$, and the coherent interaction term (Eq. 5) will now be $$\delta E = 2\eta Re[(iA'_1)A'_2{}^*] = -2\eta Im[A'_1 A'_2{}^*] \text{ (with phase shift)} \quad \text{Eq. 6}$$

(wherein "Im" denotes the imaginary part of a complex-valued quantity). If $A'_1$ and $A'_2$ are phase-matched, as assumed above (i.e., if $A'_1 A'_2{}^*$ is real-valued), the interaction term vanishes, $$\delta E = 0 \text{ (with phase shift)} \quad \text{Eq. 7}$$

Figure 2:
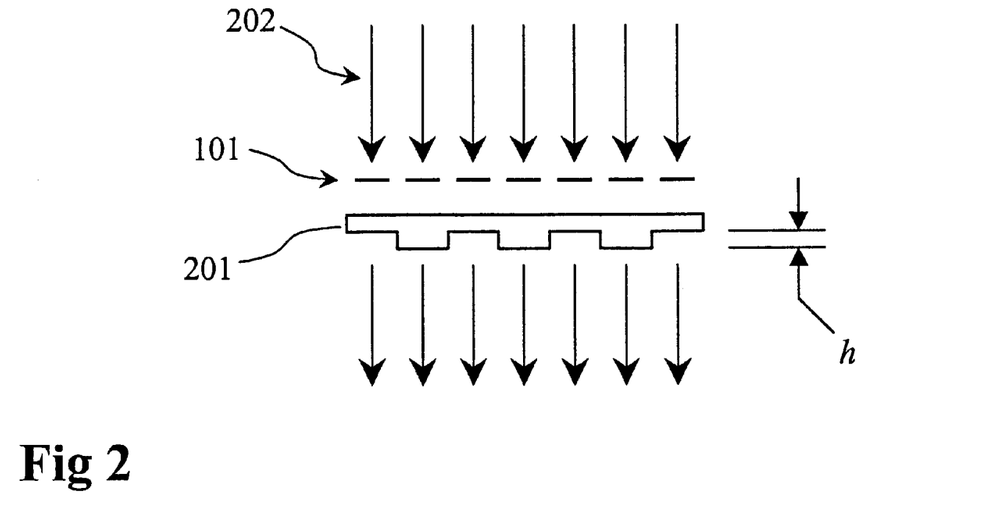
FIG. 2 illustrates a transmission-type SLM and phase plate.
Figure 3:
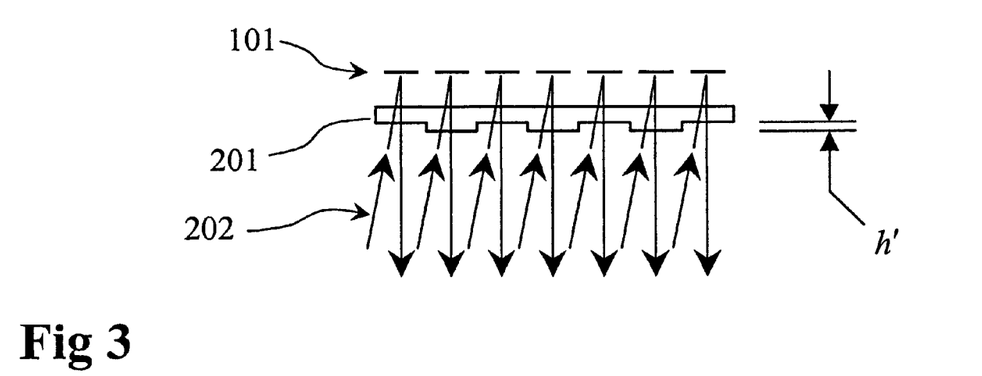
FIG. 3 illustrates a reflection-type SLM and phase plate.
Figure 4:
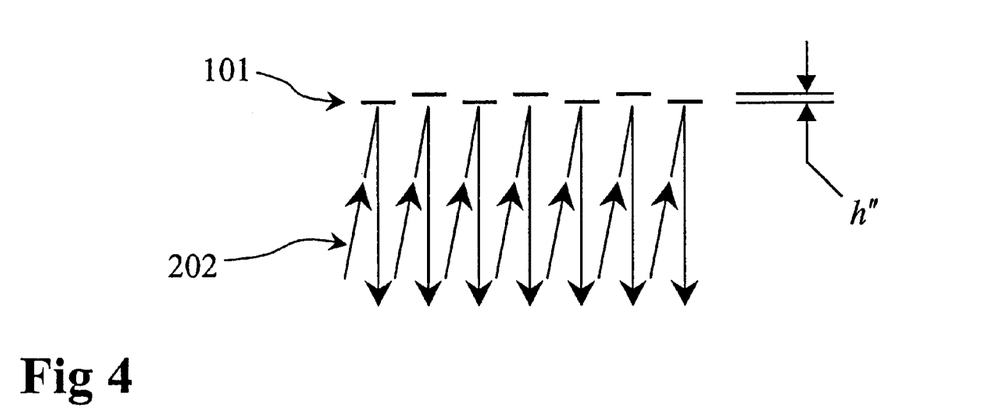
FIG. 4 illustrates a reflection-type SLM with alternate pixels recessed to induce a phase shift.

FIGS. 2–4 illustrate several phase-shifting mechanisms. In FIG. 2 the SLM 101 is transmission-type device and the design modification is the addition of a phase plate 201 whose optical thickness distribution is designed to provide the desired phase shift. The incident illumination 202 transmits through and is modulated by the SLM, and then transmits through the phase plate. (The phase plate could alternatively precede the SLM in the optical path, or the phase-shifting medium could be formed integrally within the SLM.) The phase plate comprises two optical media (e.g., glass and air in FIG. 2) sharing a common boundary surface across which the beam transmits. Portions of the beam that transmit through adjacent pixels (e.g., pixels $p_1$ and $p_2$ in FIG. 1) traverse different optical path lengths in the two optical media. The thickness difference h between portions of the phase plate traversed by adjacent source fields is selected to induce the $\pi/2$ phase shift between adjacent pixels. If the exposure wavelength is $\lambda$, the refractive indices of the optical media at wavelength $\lambda$ are $n_1$ and $n_2$, and the illumination transmits through the phase plate at normal incidence, then the optimal h value would be $$h = |\lambda/(4(n_1 - n_2))| \quad \text{Eq. 8}$$

(If the illumination is not monochromatic the phase shift cannot be optimized for all illumination wavelengths simultaneously, but it can at least be optimized for a specific design wavelength within the illumination's spectral band.)

FIG. 3 shows a reflective SLM design similarly modified. In this case the SLM 101 is illuminated in reflection mode, and the illumination 202 transmits through the phase plate 201 twice, once before intercepting the SLM, and then again after reflection. Because of the double-pass transmission, the thickness difference h' would be selected to induce a single-pass phase shift of just $\pi/4$. In this case the optimum h' (for normal incidence) would be $$h' = |\lambda/(8(n_1 - n_2))| \quad \text{Eq. 9}$$

FIG. 4 shows another design approach that applies to reflective SLM's, namely to recess alternate pixels. Portions of the beam intercepting recessed pixels will traverse slightly longer optical paths between the illumination source and the printing surface, as compared to non-recessed pixels. This path length difference will induce a relative phase shift, which can be set to $\pi/2$ by appropriate choice of the recess depth h". For normal incidence, the recess depth would be $$h'' = \lambda/8 \quad \text{Eq. 10}$$

Figure 5A:
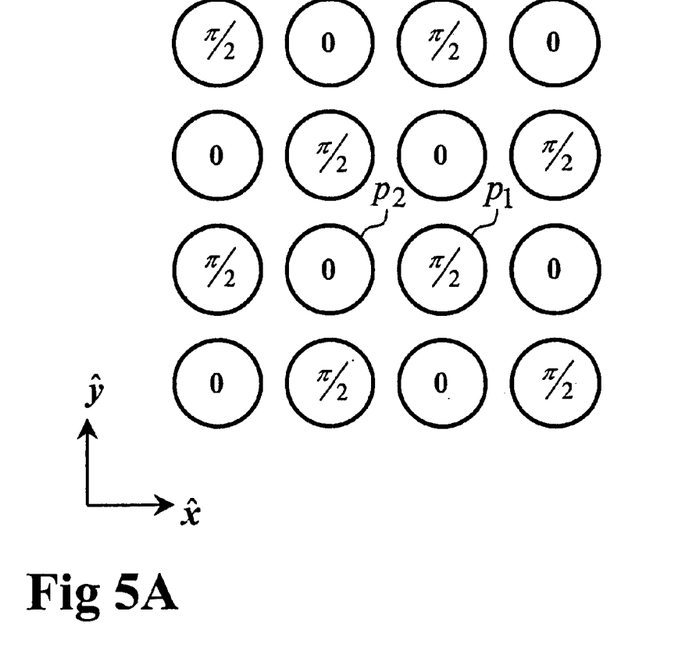
FIGS. 5A and 5B illustrate alternative phase shift distributions over a two-dimensional pixel array.
Figure 5B:
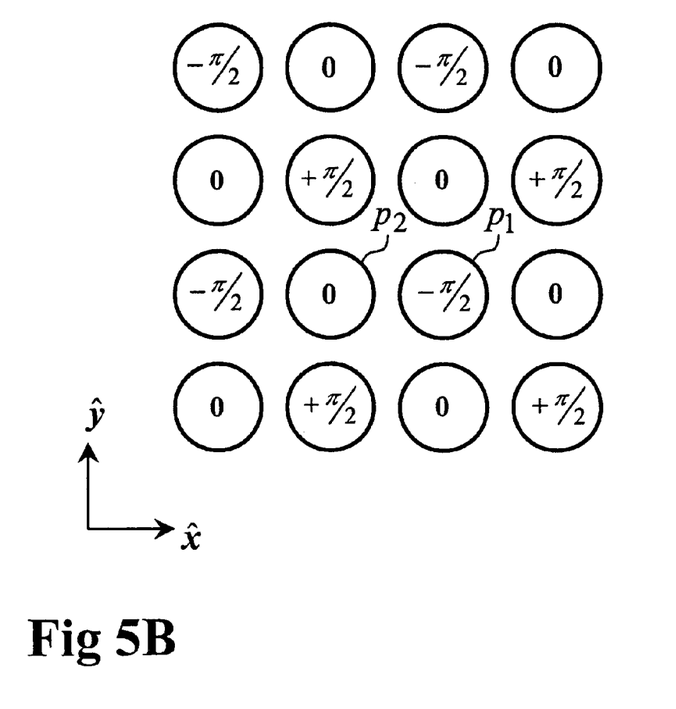

FIGS. 1–4 are cross-sectional views that show just a single row of pixels, but the cross talk suppression technique can also be applied to two-dimensional pixel arrays. FIG. 5A illustrates a portion of a rectangular arrangement of source pixels (e.g., pixels $p_1$ and $p_2$), with the induced phase shift indicated on each pixel. There is a $\pi/2$ phase discontinuity between each pair of pixels that are adjacent along either the $\hat{x}$ or $\hat{y}$ directions. The above examples all use bilevel phase distributions, but more than two phase levels could be used. For example, FIG. 5B illustrates an alternative trilevel distribution with three phase levels, 0, $+\pi/2$, and $-\pi/2$.

Figures 6, 8:
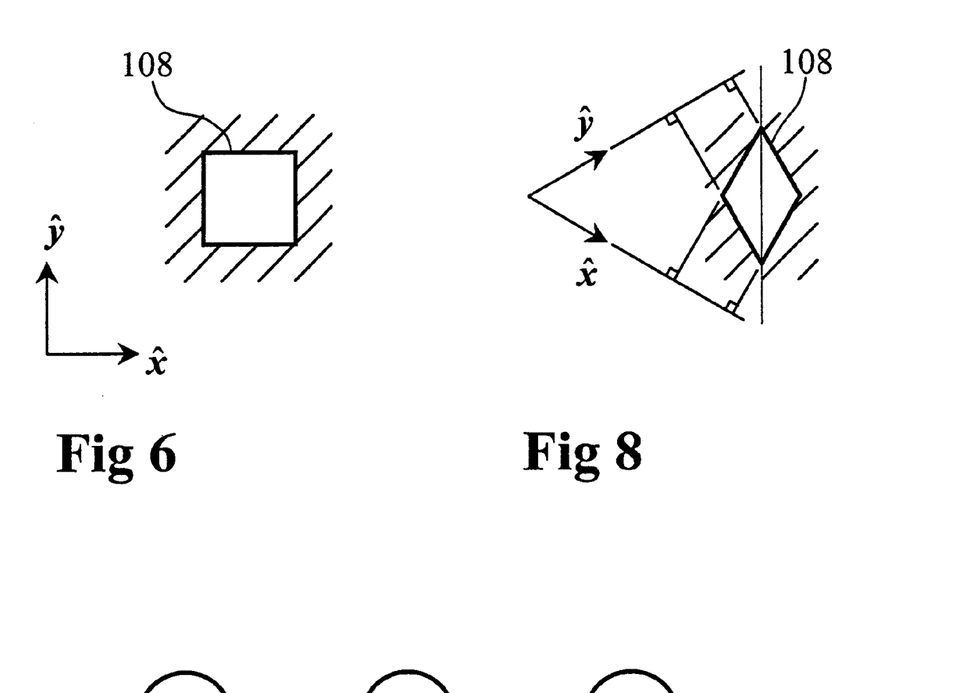
FIG. 6 is a plan view of a rectangular projection aperture.
FIG. 8 is a plan view of a parallelogram-shaped projection aperture.

The phase distributions illustrated in FIGS. 5A and B mitigate phase interactions between pixels that are adjacent along the $\hat{x}$ or $\hat{y}$ directions, but not between diagonally adjacent pixels. However, the phase interactions between diagonally adjacent pixels can be substantially eliminated by making the projection system's limiting aperture rectangular, with the aperture edges aligned to the $\hat{x}$ or $\hat{y}$ directions so that the aperture diffraction is substantially confined to the $\hat{x}$ or $\hat{y}$ directions. FIG. 6 illustrates a plan view of a projection aperture 108 of this form. (The phase interactions and cross talk between pixels can also be further mitigated by using an apodized projection aperture, preferably with an apodization function that is multiplicatively separable in the x and y coordinates corresponding to the $\hat{x}$ or $\hat{y}$ directions.)

Figure 7:
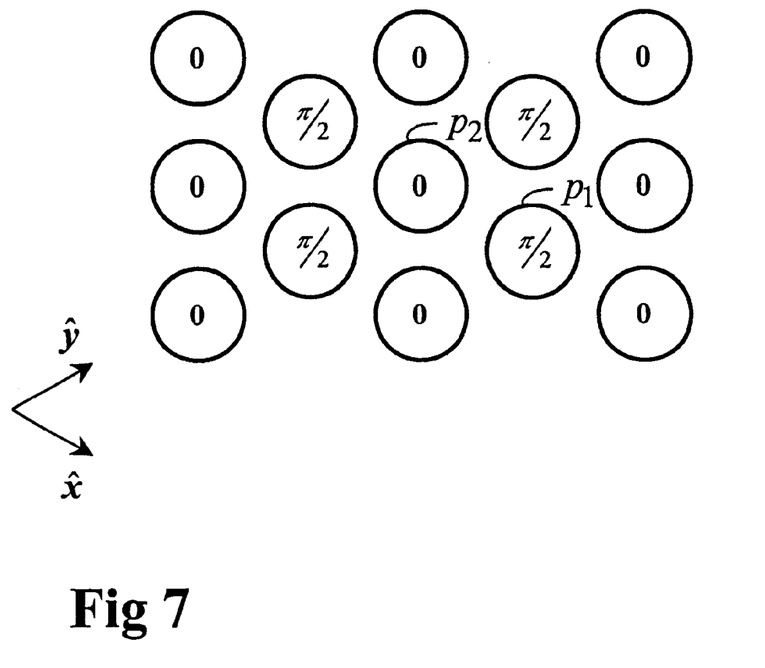
FIG. 7 is a plan view of a two-dimensional, phase-shifted pixel array with a non-rectangular centering pattern.

The phase shift technique can also be used with pixel arrays that have a non-rectangular centering pattern, as illustrated in FIG. 7. In this case the array pattern is periodic in each of two non-orthogonal directions indicated as $\hat{x}$ and $\hat{y}$, and pixels that are adjacent along either of these two directions have an induced relative phase shift of $\pi/2$. The projection aperture 108 has a parallelogram shape with edges perpendicular to the $\hat{x}$ and $\hat{y}$ directions, as illustrated in FIG. 8, so that the aperture-diffracted light is substantially confined to the $\hat{x}$ and $\hat{y}$ directions. (Aperture apodization could also be employed with this type of system, as described above.)

The cross talk suppression technique described above relies on the phase matching condition (i.e., the $A'_1 A'_2{}^*$ term in Eq. 6 must be real-valued); however this requirement can be eliminated by using a double-exposure technique in which the printing surface is exposed twice with the pixel phase shift sign-inverted between exposures. In the first exposure, the exposure field $A'_1$ has an extra factor of i applied as described above, representing $\pi/2$ phase shift. The first exposure's irradiance distribution will include a coherent interaction term $\delta E_{(1)}$ as given by Eq. 6, $$\delta E_{(1)} = 2\eta Re[(iA'_1)A_2'^*] = -2\eta Im[A_1'A'_2{}^*]$$ Eq. 11

However, in this case no special phase relationship between $A'_1$ and $A'_2$ is assumed, so the coherent interaction term need not vanish. In the second exposure the lateral positioning relationship between the SLM and printing surface is changed so that each source pixel channels illumination to a different portion of the printing surface. Typically, the positional relationship would be changed by laterally translating the printing surface, although this could also be accomplished by moving the SLM.

Figure 9:
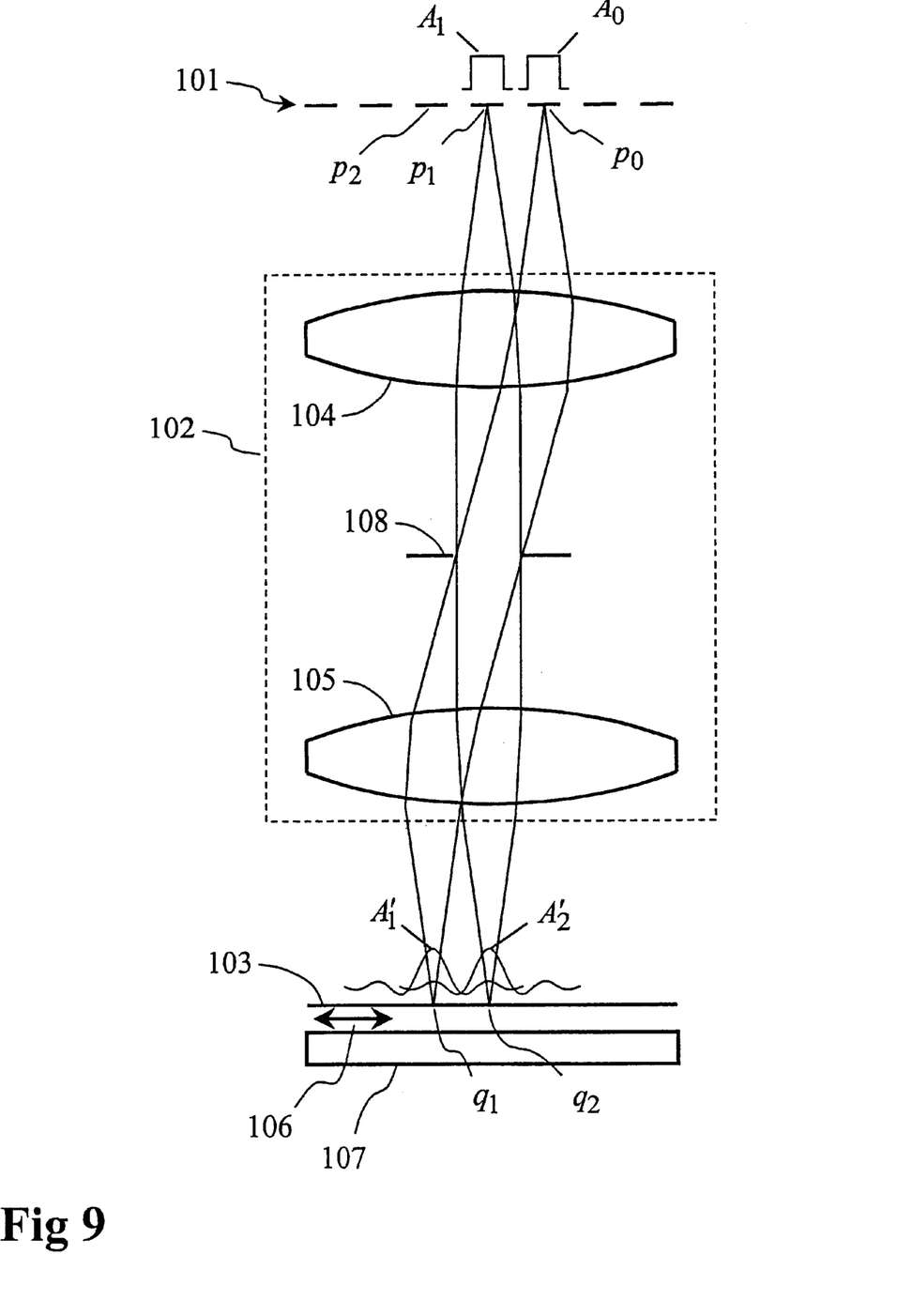
FIG. 9 illustrates the printing system of FIG. 1 with the printing surface positionally shifted to sign-invert the phase shift.

For example, FIG. 9 illustrates an exposure configuration that is similar to FIG. 1, except that the printing surface 103 has been laterally shifted so that surface points $q_1$ and $q_2$ now receive illumination from respective source pixels $p_0$ and $p_1$ (rather than $p_1$ and $p_2$, cf. FIG. 1). In FIG. 9 $A'_1$ and $A'_2$ represent exposure fields associated with respective surface points $q_1$ and $q_2$—not pixels $p_1$ and $p_2$. In the second exposure, the exposure field $A'_1$ is generated by the source pixel $p_0$ and source field $A_0$, and field $A'_2$ is generated by source pixel $p_1$ and source field $A_1$. Thus, the $\pi/2$ phase shift is applied to $A'_2$, rather than $A'_1$, in the second exposure, and the second exposure's irradiance distribution will include a coherent interaction term $\delta E_{(2)}$ as given by $$\delta E^{(2)} = 2\eta Re[A'_1(iA'_2)^*] = +2\eta Im[A_1'A'_2{}^*]$$ Eq. 12

The cumulative interaction term, summed over both exposures, is zero $$\delta E^{(1)} + \delta E^{(2)} = 0$$ Eq. 13

In the FIG. 9 example, the printing surface is positionally shifted by one image pixel unit between the two exposures. However, the positional shift could generally be any odd number of pixel units—this will have the same effect of sign-inverting the phase shift. For a two-dimensional pixel array with periodicity directions $\hat{x}$ and $\hat{y}$, the positional shift could consist of an odd number of pixel steps in one of the two principal directions ($\hat{x}$ or $\hat{y}$) and an even number of steps in the other principal direction. (The odd number is preferably 1, and the even number is preferably 0.)

Figure 10:
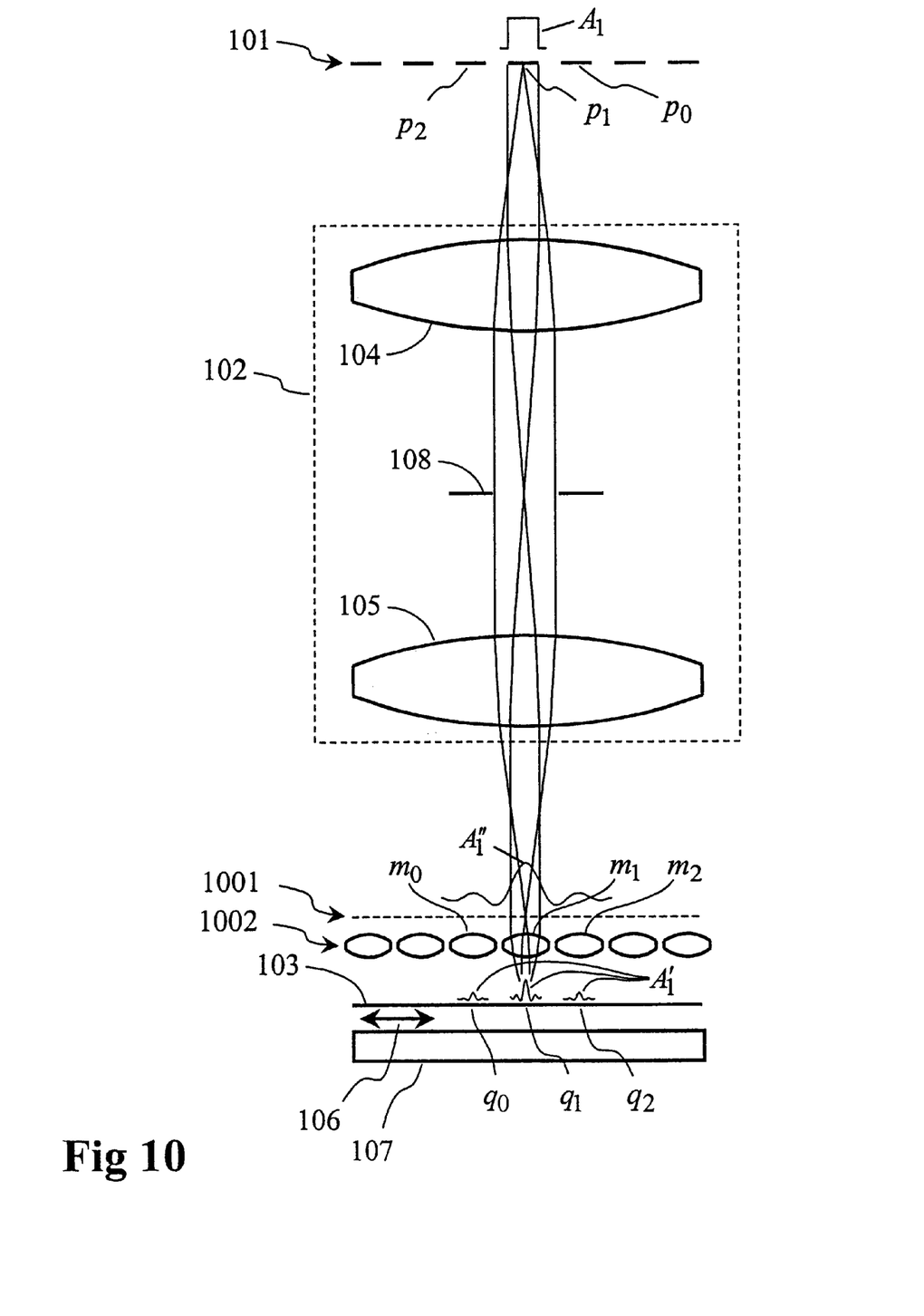
FIG. 10 schematically illustrates a microlens printing system.

In the above examples the SLM is imaged directly onto the printing surface, but the invention can also be used advantageously with a microlens printing system (Ref 4) in which a microlens array is interposed between the projection optics and the printing surface. FIG. 10 schematically illustrates a system of this type. As in the above illustrations (FIGS. 1 and 9) a projection system 102 images the SLM 101 onto an image plane 1001; but in FIG. 10 the printing surface 103 is not located at the image plane. Instead, a microlens array 1002 proximate to image plane 1001 condenses the image radiation from each source pixel onto a highly resolved focal point on the printing surface, and the printing surface is raster-scanned to build up a digitally synthesized image as the source pixels modulate the focal point intensities.

The microlens array comprises microlens elements $m_0$, $m_1$, $m_2$, etc. that are associated with corresponding source pixels $p_0$, $p_1$, $p_2$, etc., wherein each microlens is located proximate to the corresponding pixel's image position on image plane 1001. Each pixel's source field is imaged onto a corresponding image field, which is primarily focused within the corresponding microlens aperture. For example, the source field $A_1$ from pixel $p_1$ is imaged to field $A''_1$, which is primarily concentrated within microlens $m_1$. Each such image field is then focused by the microlens array onto an exposure field that is primarily concentrated at the corresponding microlens's focal point. For example, image field $A''_1$ from pixel $p_1$ is condensed down to an exposure field $A'_1$ that is primarily concentrated at microlens $m_1$'s focal point, $q_1$. However, the diffraction tails of field $A''_1$ will typically overlap adjacent microlenses $m_0$ and $m_2$, so the exposure field $A'_1$ will also include small energy peaks at the focal points $q_0$ and $q_2$ of microlenses $m_0$ and $m_2$. The amount of energy in these side peaks would typically not be significant when pixel $p_1$ is turned on and adjacent pixels $p_0$ and $p_2$ are turned off. But when pixel $p_1$ and any adjacent pixels are simultaneously turned on, the coherent interaction between their corresponding exposure fields can be much more significant. This coherent interaction can be significantly mitigated by phase-shifting the modulated source fields by the method described previously. Typically, the phase matching condition would not be satisfied because the SLM is not imaged onto the printing surface; thus the double-exposure method would typically be used. The double exposure can be implemented by raster-scanning the printing surface twice, with the SLM positionally shifted by one pixel step between exposures (e.g., so that the position of pixel $p_0$ in the second exposure coincides with the position of pixel $p_1$ in the first exposure). Alternatively, the SLM can be kept stationary and the raster scan (indicated as 106 in FIG. 10) can simply be extended so that any typical exposure point on the printing surface is sequentially exposed through at least two adjacent microlenses.

Figure 11:
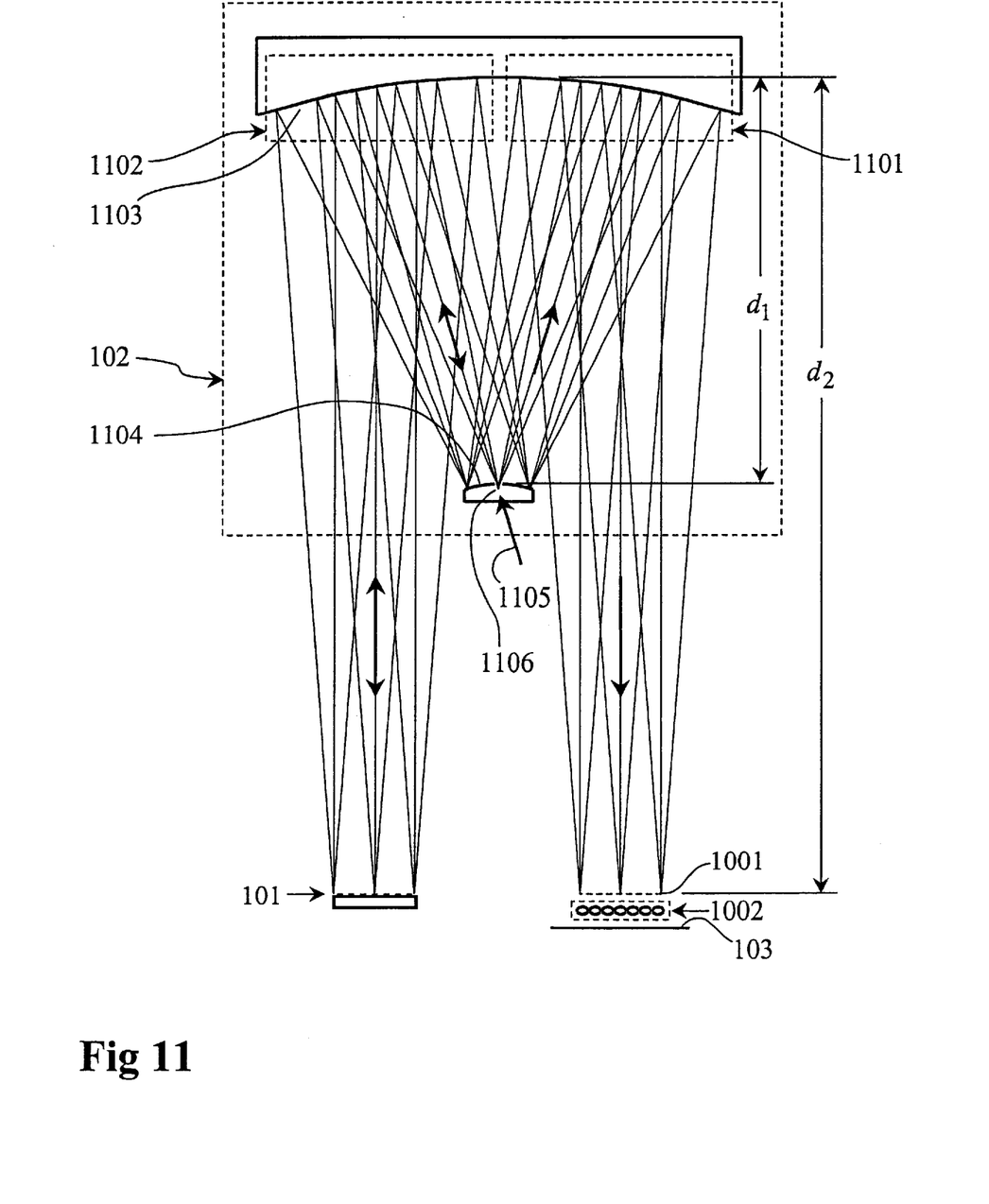
FIG. 11 illustrates an Offner catoptric projection system.

FIG. 11 illustrates a variant of the FIG. 10 configuration in which the projection system 102 has the form of an "Offner Catoptric System" design of the type described in "Lens Design Fundamentals," by Rudolph Kingslake, Academic Press, 1978; p. 321. In this design, the lenses 104 and 105 are functionally replaced with off-axis portions 1101 and 1102 of an approximately spherical mirror 1103, and the projection aperture 108 is functionally replaced with a small, spherical mirror 1104. (Illumination 1105 is brought into the system through a pinhole aperture 1106 in mirror 1104.) The axial distance between mirrors 1103 and 1104 is denoted as $d_1$, and the axial distances from the SLM 101 and from the image plane 1001 to mirror 1103 are approximately identical and are denoted as $d_2$. The surface curvature radius of mirror 1104 is approximately $d_1$; the surface curvature radius of mirror 1103 is approximately $d_2$; and $d_2$ is approximately equal to $2d_1$. (The projection system 102 in FIG. 1 could similarly comprise an Offner catoptric system of this type.)

REFERENCES

The following references are incorporated by reference:

1. William C. Sweatt and Richard H. Stulen, "Maskless Lithography," U.S. Pat. No. 5,870,176, issued Feb. 9, 1999.

2. Gregory D. Cooper and Richard M. Mohring, "Transferring a programmable pattern by photon lithography," pending patent application, publication WO9900706, filed Jun. 25, 1998.

3. Natale M. Ceglio and David A. Markle, "Maskless, Reticle-Free Lithography," U.S. Pat. No. 5,691,541, issued Nov. 25, 1997.

4. Kenneth C. Johnson, "Microlens Scanner for Microlithography and Wide-Field Confocal Microscopy," pending patent application, publication WO9734171, filed Feb. 20, 1997.

5. G. R. Padmanabhan, "Lithography Systems Employing Programmable Reticles," pending patent application, publication WO9705526, filed Jul. 25, 1996.

6. Kanti Jain and Jeffrey M. Hoffman, "Seamless, Maskless Lithography System Using Spatial Light Modulator," pending patent application, publication WO9804950, filed Jul. 25, 1996.

While the above is a complete description of specific embodiments of the invention, various modifications, alternative constructions, and equivalents may be used. Therefore, the above description should not be taken as limiting the scope of the invention as defined by the claims.

What is claimed is:

1. A printing system comprising:
    a spatial light modulator (SLM) for image generation, the SLM comprising an array of source pixel elements, wherein each source pixel modulates illumination intercepting that pixel;
    an illumination source disposed to illuminate the SLM, whereupon modulated illumination leaves the SLM; and
    an optical projection system disposed to convey the modulated illumination from the SLM to a printing surface, wherein each source pixel generates a corresponding modulated exposure field that exposes the printing surface;
    the SLM being configured to induce a phase difference of approximately $\pi/2$ between adjacent exposure fields.

2. The printing system of claim 1, and further comprising a planar array of microlenses proximate the printing surface wherein the exposure field corresponding to each source pixel comprises a primary radiation component that has intercepted and been focused by a microlens corresponding to the source pixel, but which may also comprise a secondary radiation component that has intercepted and been focused by adjacent microlenses.

3. The printing system of claim 1 wherein the SLM pixel array is a two-dimensional array.

4. The printing system of claim 1 wherein the SLM pixel array is a one-dimensional, linear array.

5. The printing system of claim 1 wherein the illumination transmits through the SLM.

6. The printing system of claim 1 wherein the illumination reflects off of the SLM.

7. The printing system of claim 6, wherein the SLM is configured with alternate source pixels recessed relative to their adjacent pixels, with the recess depth selected to induce a phase difference of approximately $\pi/2$ between adjacent pixels.

8. The printing system of claim 1, wherein:
    the SLM is configured with a phase-shifting mechanism that comprises two optical media proximate the source pixels;
    the two media have different refractive indices;
    portions of the illumination that intercept any two adjacent source pixels traverse different optical path lengths through the two media; and
    the optical path length difference between adjacent pixels is selected to induce a phase difference of approximately $\pi/2$ between adjacent pixels.

9. The printing system of claim 1, wherein the projection system comprises an Offner catoptric system.

10. A printing system comprising a Spatial Light Modulator (SLM), an illumination source, an optical projection system, a printing surface, and a positioning mechanism, wherein:
    the illumination source illuminates the SLM;
    the SLM comprises an array of source pixel elements, wherein each source pixel modulates the illumination intercepting that pixel;
    the projection system conveys the modulated illumination from the SLM to the printing surface, wherein each source pixel generates a corresponding modulated exposure field that exposes the printing surface;
    the SLM further comprises a phase-shifting mechanism that induces a phase difference of approximately $\pi/2$ between adjacent exposure fields;
    the positioning mechanism controls the positional relationship between the printing surface and the SLM; and
    at least two exposures are applied to the printing surface, wherein the two exposures are substantially identical except that the positional relationship is altered between the two exposures so as to invert the sign of the phase difference, and whereby the sign inversion causes coherent interaction between adjacent exposure fields to substantially cancel out between the two exposures.

11. The printing system of claim 10 wherein the SLM pixel array is a two-dimensional array.

12. The printing system of claim 10 wherein the SLM pixel array is a one-dimensional, linear array.

13. The printing system of claim 10 wherein the illumination transmits through the SLM.

14. The printing system of claim 10 wherein the illumination reflects off of the SLM.

15. The printing system of claim 14, wherein:
  alternate source pixels are recessed relative to their adjacent pixels;
  the phase-shifting mechanism comprises the pixel recesses; and
  the recess depth is selected to induce a phase difference of approximately π/2 between adjacent pixels.

16. The printing system of claim 10, wherein:
  the phase-shifting mechanism comprises two optical media proximate the source pixels;
  the two media have different refractive indices;
  portions of the illumination that intercept any two adjacent source pixels traverse different optical path lengths through the two media; and
  the optical path length difference between adjacent pixels is selected to induce a phase difference of approximately or π/2 between adjacent pixels.

17. The printing system of claim 10 wherein the projection system images the source pixels onto the printing surface.

18. The printing system of claim 10 wherein
  the printing system further comprises a planar array of microlenses proximate the printing surface,
  the exposure field corresponding to each source pixel comprises a primary radiation component that has intercepted and been focused by a microlens corresponding to the source pixel, but which may also comprise a secondary radiation component that has intercepted and been focused by adjacent microlenses,
  the two exposures cause the coherent interactions between the primary radiation component from each source pixel and the secondary radiation component from other adjacent source pixels to substantially cancel out.

19. The printing system of claim 9, wherein the projection system comprises an Offner catoptric system.

20. A method of operating a printing system that includes a spatial light modulator (SLM) for image generation, the SLM comprising an array of light-modulating pixels, the method comprising:
  illuminating the SLM;
  controlling the SLM in accordance with a desired information pattern so that each pixel modulates the illumination intercepting that pixel;
  projecting the modulated illumination from the SLM to a printing surface so that each pixel generates a corresponding modulated exposure field that exposes the printing surface; and
  inducing a phase difference of approximately π/2 between adjacent exposure fields.

21. The method of claim 20 wherein inducing a phase difference comprises configuring the SLM with a phase-shifting mechanism that comprises two optical media proximate the source pixels wherein the two media have different refractive indices and the optical path length difference between adjacent pixels is selected to induce a phase difference of approximately π/2 between adjacent pixels.

22. The method of claim 20 wherein the illumination is reflected by the SLM, and wherein inducing a phase difference comprises configuring the SLM with alternate source pixels recessed relative to their adjacent pixels, with the recess depth selected to induce a phase difference of approximately π/2 between adjacent pixels.

23. The method of claim 20 wherein said projecting the modulated illumination from the SLM to a printing surface includes projecting the modulated illumination on a planar array of microlenses proximate the printing surface wherein the exposure field corresponding to each source pixel comprises a primary radiation component that has intercepted and been focused by a microlens corresponding to the source pixel, but which may also comprise a secondary radiation component that has intercepted and been focused by adjacent microlenses.

24. A method of operating a printing system that includes a spatial light modulator (SLM) that comprises an array of light-modulating pixels, the method comprising:
  illuminating the SLM;
  controlling the SLM in accordance with a desired information pattern so that each pixel modulates the illumination intercepting that pixel;
  projecting the modulated illumination from the SLM to a printing surface so that each pixel generates a corresponding modulated exposure field that exposes the printing surface;
  inducing a phase difference of approximately π/2 between adjacent exposure fields;
  applying a first exposure to the printing surface;
  altering the positional relationship between the printing surface and the SLM in a manner that inverts the sign of the phase difference; and
  applying a second exposure to the printing surface, whereby the sign inversion causes coherent interaction between adjacent exposure fields to substantially cancel out between the two exposures.

25. The method of claim 24 wherein inducing a phase difference comprises configuring the SLM with a phase-shifting mechanism that comprises two optical media proximate the source pixels wherein the two media have different refractive indices and the optical path length difference between adjacent pixels is selected to induce a phase difference of approximately π/2 between adjacent pixels.

26. The method of claim 24 wherein the illumination is reflected by the SLM, and wherein inducing a phase difference comprises configuring the SLM with alternate source pixels recessed relative to their adjacent pixels, with the recess depth selected to induce a phase difference of approximately π/2 between adjacent pixels.

27. The method of claim 24 wherein the illumination is reflected by the SLM, and wherein the printing system includes a planar array of microlenses proximate the printing surface wherein the exposure field corresponding to each source pixel comprises a primary radiation component that has intercepted and been focused by a microlens corresponding to the source pixel, but which may also comprise a secondary radiation component that has intercepted and been focused by adjacent microlenses.

* * * * *

UNITED STATES PATENT AND TRADEMARK OFFICE
CERTIFICATE OF CORRECTION

PATENT NO. : 6,489,984 B1
DATED : December 3, 2002
INVENTOR(S) : Kenneth Carlisle Johnson It is certified that error appears in the above-identified patent and that said Letters Patent is hereby corrected as shown below:

Column 3,
Line 39, Eq. 5, change "E" to -- $\delta E$ --.

Column 4,
Line 39, Eq. 8, change "A" to -- $\lambda$ --.

Column 5,
Line 45, change "$\delta E_{(1)}$" to -- $\delta E^{(1)}$ --.
Line 46, Eq. 11, change "$\delta E_{(1)}$" to -- $\delta E^{(1)}$ --.

Column 6,
Line 2, change "$\delta E_{(2)}$" to -- $\delta E^{(2)}$ --.

Column 9,
Line 40, change "9" to -- 10 --.

Signed and Sealed this

Twenty-ninth Day of July, 2003

JAMES E. ROGAN
*Director of the United States Patent and Trademark Office*